US006850106B1

United States Patent
Kunanayagam et al.

(10) Patent No.: US 6,850,106 B1
(45) Date of Patent: Feb. 1, 2005

(54) VOLTAGE CONTROLLED OSCILLATOR DELAY CELL

(76) Inventors: Mohan Krishna Kunanayagam, Suite G02, 2320 Century Square, Jalan Usahawan, 63000 Cyberjaya (MY); Shubha Sharma, Suite G02, 2320 Century Square, Jalan Usahawan, 63000 Cyberjaya (MY)

( * ) Notice: Subject to any disclaimer, the term of this patent is extended or adjusted under 35 U.S.C. 154(b) by 0 days.

(21) Appl. No.: 10/616,326

(22) Filed: Jul. 8, 2003

(51) Int. Cl.$^7$ .............................................. H03H 11/26
(52) U.S. Cl. .................... 327/266; 327/280; 331/117 R
(58) Field of Search ................................. 327/266, 268, 327/280, 283, 287, 290, 65, 156–159, 161; 331/57, 108 B, 117 R, 34

(56) References Cited

U.S. PATENT DOCUMENTS

| 5,012,142 A | | 4/1991 | Sonntag ....................... 327/281 |
| 5,227,681 A | * | 7/1993 | Koyama et al. ............... 327/65 |
| 5,343,162 A | * | 8/1994 | Davis .......................... 330/252 |
| 5,600,280 A | | 2/1997 | Zhang .......................... 331/57 |
| 5,629,652 A | * | 5/1997 | Weiss ..................... 331/108 B |
| 5,936,475 A | * | 8/1999 | Tchamov et al. ............. 331/57 |
| 6,243,784 B1 | | 6/2001 | Anderson et al. ........... 713/401 |
| 6,351,191 B1 | * | 2/2002 | Nair et al. ..................... 331/57 |
| 6,396,357 B1 | | 5/2002 | Sun ............................. 331/57 |
| 6,472,944 B2 | | 10/2002 | Soda ........................... 331/57 |

* cited by examiner

Primary Examiner—Minh Nguyen
(74) Attorney, Agent, or Firm—DeMont & Breyer, LLC (57) ABSTRACT

A voltage-controlled oscillator design is disclosed that provides greater tuning range than a prior art differential amplifier design using "varactor" diodes. The design employs CMOS capacitors to replace varactor diodes. The CMOS capacitors are formed from PMOS transistors in which the drain of the transistor is electrically connected to the source of the same transistor, so that voltage-dependant capacitors are formed between the gate-to-source terminals and the gate-to-drain terminals of the PMOS transistor. Secondly, the monolithic inductors employed in the prior art are replaced by "active" inductors: the combination of a resistor connected in series with the gate of an NMOS transistor, where the potential at the drain of the NMOS transistor is held below that of the second terminal of the resistor by at least the threshhold, or turn-on voltage, of the transistor. The resistor/transistor combination acts inductively at the frequency of oscillation of interest.

12 Claims, 8 Drawing Sheets

GRAPH OF Zo VERSUS FREQUENCY

VOLTAGE CONTROLLED OSCILLATOR DELAY CELL

FIELD OF THE INVENTION

The present invention relates to oscillators in general, and, more particularly, to voltage-controlled ring oscillators.

BACKGROUND OF THE INVENTION

The voltage-controlled oscillator (VCO) is an important building block in phase-locked loops, clock recovery circuits, and frequency synthesizers. High frequency and radio frequency (RF) voltage-controlled oscillators can be implemented monolithically as LC oscillators, as relaxation oscillators and ring oscillators. Ring oscillators are frequently used in the prior art to generate high frequency clock signals. Ring oscillators may be controlled by a voltage or current source to generate a variable frequency signal.

Figure 1:
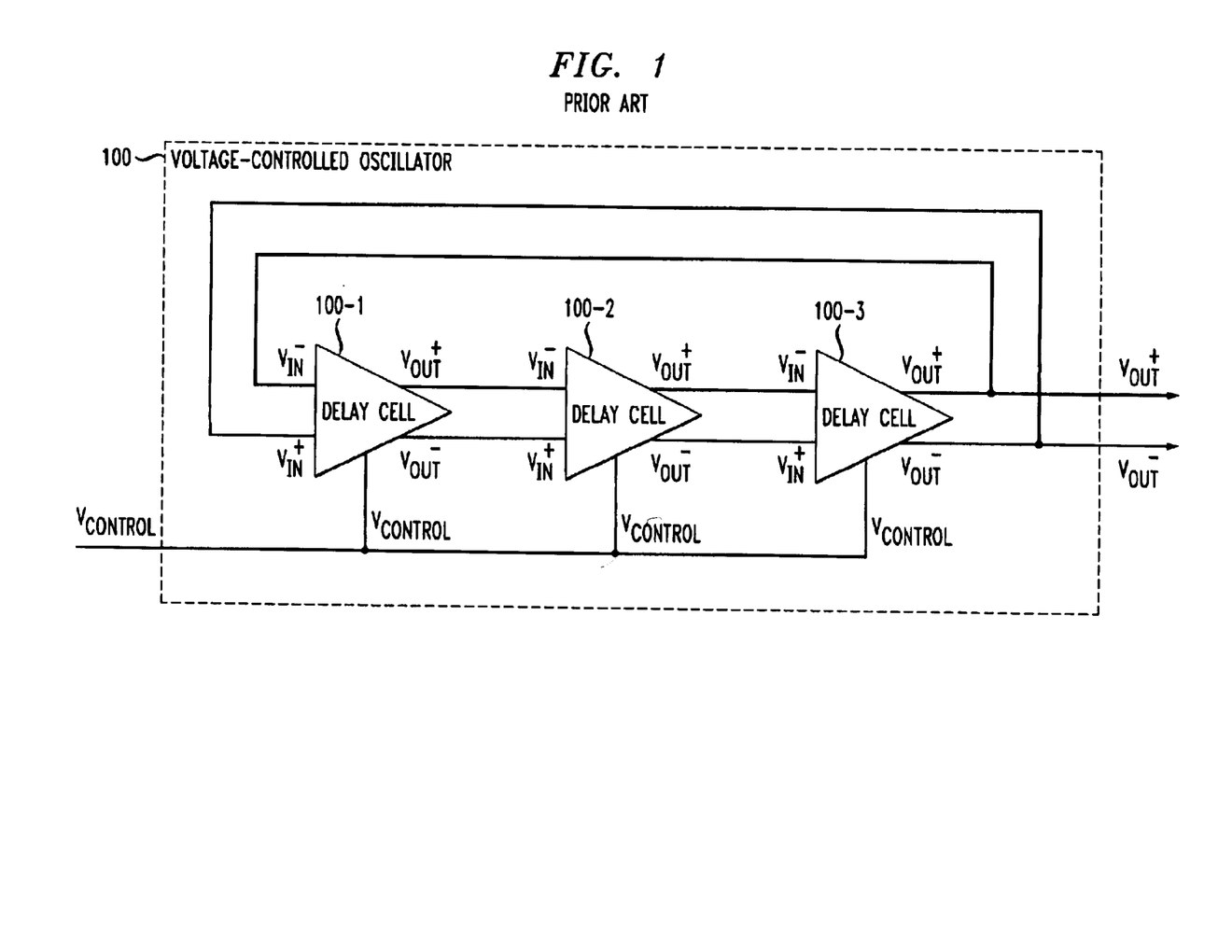
FIG. 1 depicts a block diagram of delay cells arranged as a ring voltage-controlled oscillator of the prior art.

FIG. 1 depicts a block diagram of delay cells arranged as a ring voltage-controlled oscillator of the prior art. Ring oscillator 100 comprises multiple stages of amplification and delay that are connected in tandem, with the last stage coupled back to the first stage in the form of a ring around which the signals propagate. Each stage of the ring oscillator, labeled 100-1 through 100-3 in the figure, provides a phase shift. In particular, each half period the signal will propagate around the delay cell ring with an inversion. Ring oscillators can be implemented using differential pair or current-starved single-ended inverter structures.

Figure 2:
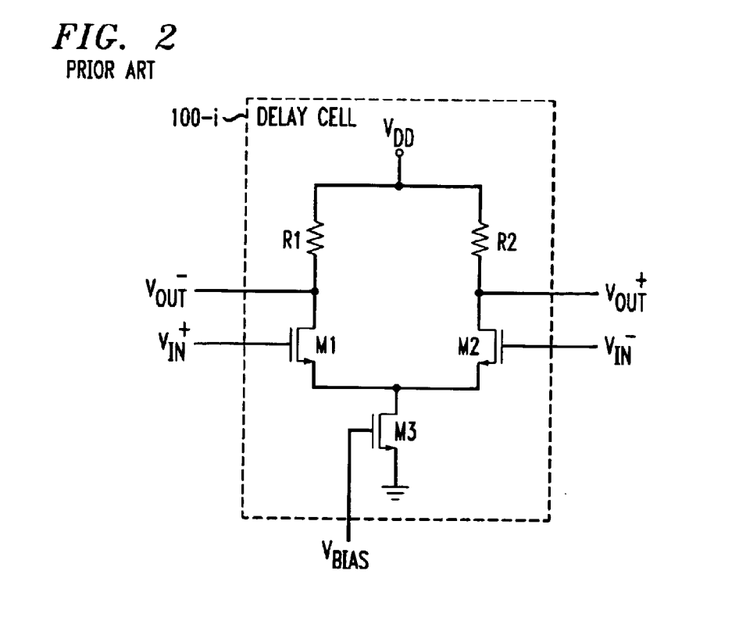
FIG. 2 depicts a schematic of a typical differential amplifier with resistive loads to implement a single delay cell.
Figure 3:
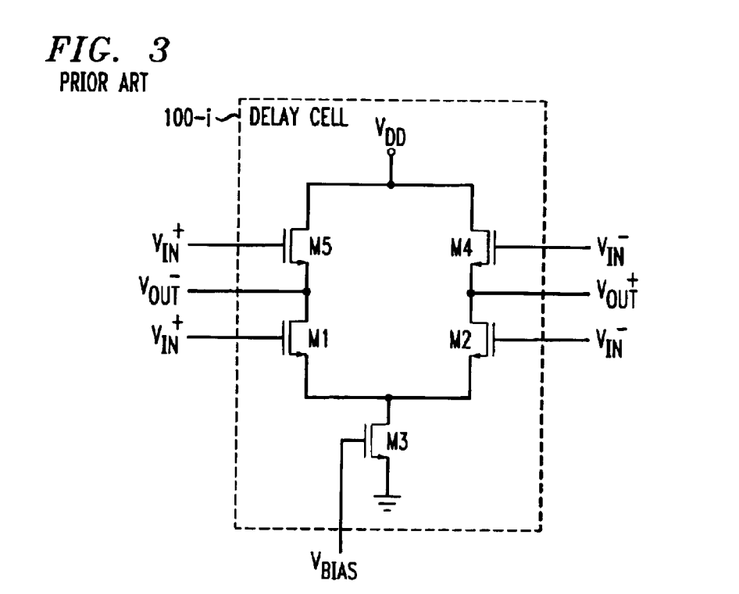
FIG. 3 is a variation of FIG. 2 in which the resistors have been replaced by MOS transistors M4 and M5.

FIG. 2 depicts a schematic of a typical differential amplifier with resistive loads to implement a single delay cell. Parasitic capacitances across the drain-to-source of transistors M1 and M2 interact at high frequency with resistors R1 and R2 to provide the requisite phase shift and gain of the delay cell. FIG. 3 is a variation of FIG. 2 in which the resistors have been replaced by MOS transistors M4 and M5. The resistors of FIG. 1 occupy a large area on a die, which can be alleviated in FIG. 2 by transistors, covering a smaller area, the latter operating in their ohmic regions to act as resistive loads. It has been recognized in the prior art that it is beneficial to use differential amplifiers for each of the stages of the ring oscillator in order to cause the oscillator to be more immune to the influence of spurious noises in the form of voltage and current spikes that might be coupled to both sides of the differential circuit. Such a spurious noise from the power supply, for example, would be coupled to both sides of the differential amplifier, and it would therefore affect both of the sides of the differential stages substantially equally. Consequently, the effect of such spurious noise is minimized on the output of the oscillator, which can be taken as the difference of the outputs of any one of the stages.

Two problems associated with using differential amplifiers in a ring oscillators are differential mode lockup and common mode lockup. Differential mode lockup refers to the phenomenon that occurs where each stage (differential amplifier) of the ring oscillator would end up with its output at either the opposite voltage limits or at the same voltage limit as the other stages. However, differential mode lockup typically only occurs in a ring oscillator with an even number of stages (e.g., 2, 4, 6, etc.). For example, in a simple two stage ring-oscillator, differential lockup could occur with the first output of stage one and the second output of stage two sitting at one voltage limit while the second output of stage one and the first output of stage two are sitting at the opposite voltage limit. Common mode lockup could occur with the first and second outputs of stage one sitting near one voltage limit while the first and second outputs of stage two are sitting near the opposite voltage limit.

Figure 4:
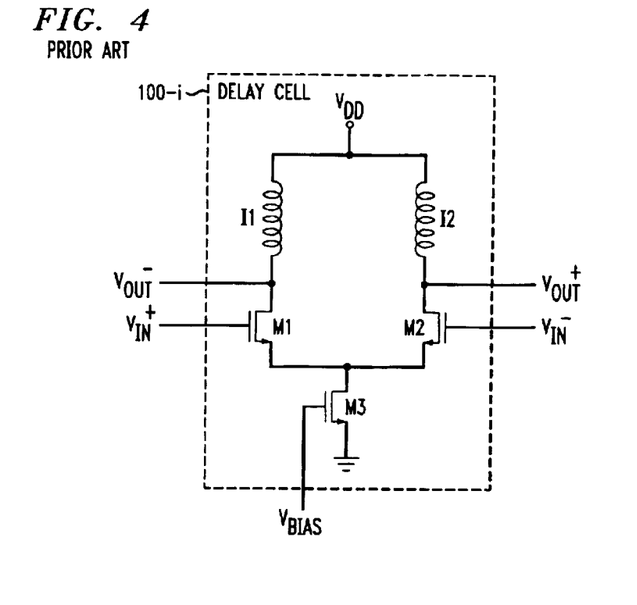
FIG. 4 depicts the resistive loads replaced by monolithic inductors.

Differential mode lockup can be prevented in a ring oscillator using an even number of stages by crossing the connections made between the outputs and the inputs for one pair (or an odd number of pairs) of connections in the ring oscillator. As a result, an additional phase inversion is provided in the differential signal path, and lockup of the oscillator on a differential basis is prevented. Alternatively, FIG. 4 depicts the resistive loads replaced by monolithic inductors. The inductors, along with the parasitic capacitors of the transistors M1 and M2, form an LC oscillator, which is free of the latch up problems of the resistive load delay cell. This configuration suffers from being dependent on large physical inductors that are hard to match and, together with the parasitic capacitance, hard to tune the oscillation frequency.

Figure 5:
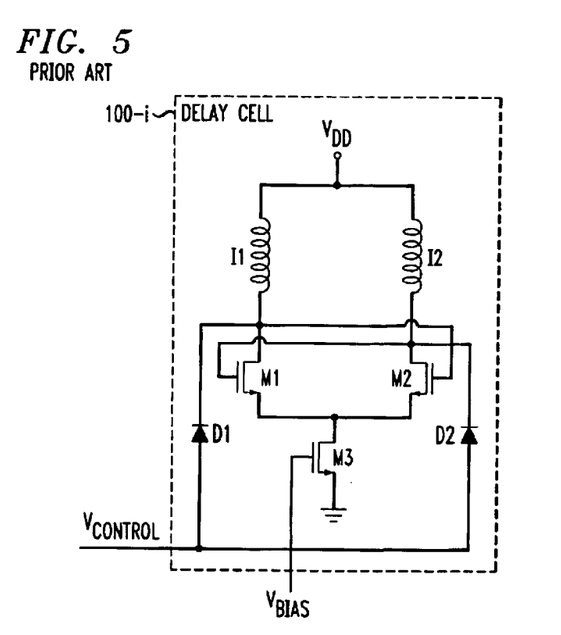
FIG. 5 shows diodes D1 and D2 as reversed biased PN junctions acting as varactors added as shown to the circuit of FIG. 4.

The oscillation frequency of LC topologies is equal to $$f_{osc} = \frac{1}{2\pi\sqrt{LC}}$$

suggesting that only the inductor and capacitor values can be varied to tune the frequency. Since it is difficult to vary the values of the monolithic inductors and the parasitic capacitances, we can replace the parasitic capacitance with a voltage dependent capacitor called a "varactor." FIG. 5 shows diodes D1 and D2 as reversed biased PN junctions acting as varactors added as shown to the circuit of FIG. 4. VC sets the voltage across diodes D1 and D2, producing a tuning range for the capacitance values which in turn tunes the LC oscillator.

Besides the above-mentioned limitation of monolithic inductor implementations, the PN junction-type varactor has a very limited range of reverse bias voltage, yielding a limited range of tuning frequency.

SUMMARY OF THE INVENTION

To provide greater tuning range than that provided by "varactor" diodes, the diodes are replaced with PMOS transistors in series with the drains of transistors M1 and M2 of FIG. 5. The drain and sources of the PMOS transistors are electrically connected to each other, so that voltage-dependant CMOS capacitors are formed between the gate-to-source terminals and the gate-to-drain terminals of the PMOS transistor.

Secondly, the monolithic inductors of FIG. 5 are replaced by "active" inductors: the combination of a resistor connected in series with the gate of an NMOS transistor, where the potential at the drain of the NMOS transistor is held below that of the second terminal of the resistor by at least the threshold, or turn-on voltage, of the transistor, acts inductively at the frequency of oscillation of interest. The differential amplifier structure is maintained from FIG. 5.

The illustrative embodiment comprises: a first NMOS field effect transistor having a gate terminal, a source terminal, and a drain terminal; a first resistor having a first terminal and second terminal, wherein said first terminal of said first resistor is electrically connected to said gate terminal of said first NMOS field effect transistor; a first PMOS field effect transistor having a gate terminal, a source terminal, and a drain terminal, wherein said source terminal of said first PMOS field effect transistor is electrically connected to said source terminal of said first NMOS field effect transistor; and a second NMOS field effect transistor having a gate terminal, a source terminal, and a drain terminal, wherein said drain terminal of said second NMOS field effect transistor is electrically connected to said drain terminal of said first PMOS field effect transistor, and wherein said drain terminal of said first PMOS field effect transistor is electrically connected to said source terminal of said first PMOS field effect transistor.

DETAILED DESCRIPTION

Figure 6:
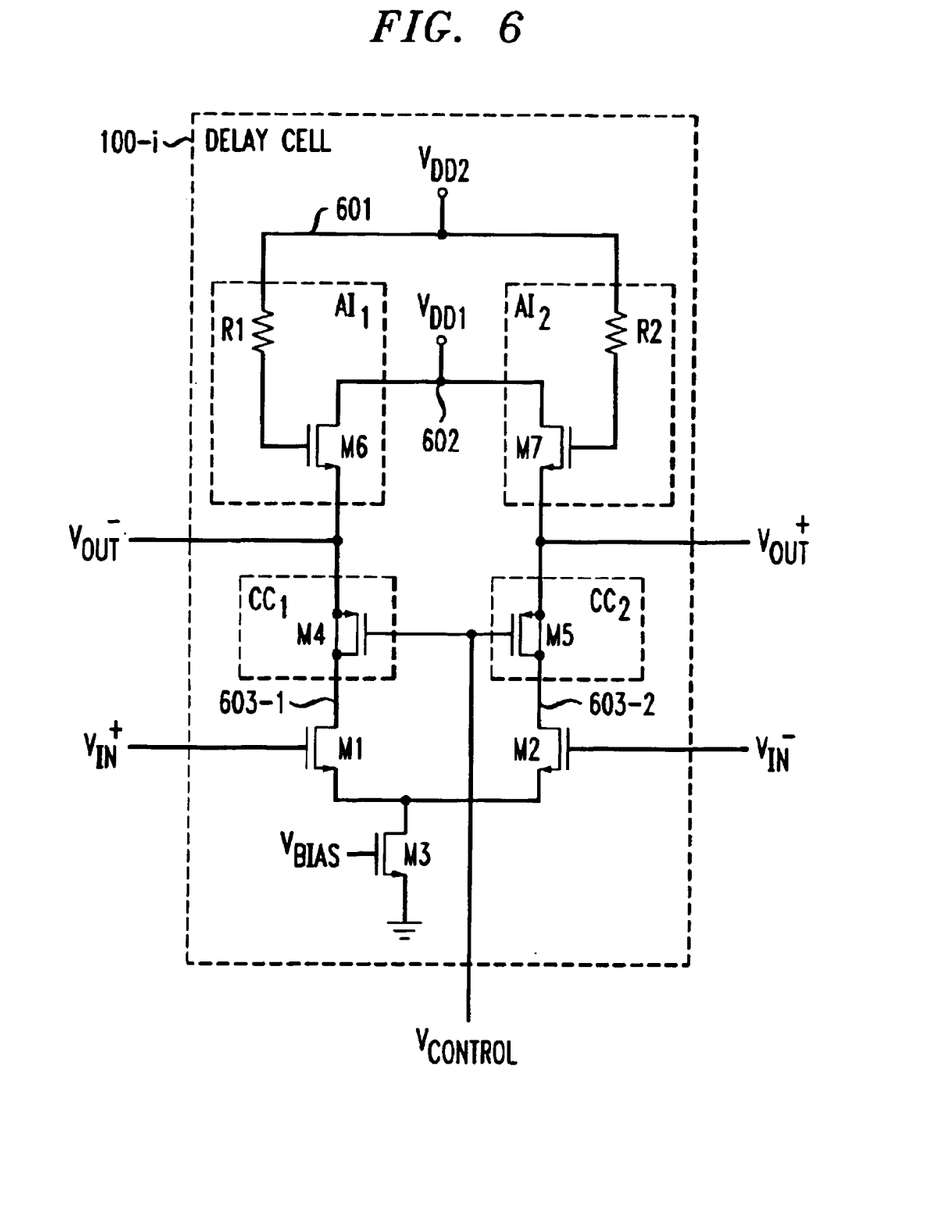
FIG. 6 depicts a schematic diagram of the salient components of the illustrative embodiment of the present invention.

FIG. 6 depicts a schematic diagram of the salient components of the illustrative embodiment of the present invention. Resistor R1 is connected at one end to a positive power supply $V_{DD2}$ at 601, and at its other end to the gate terminal of NMOS transistor M6. The drain terminal of NMOS transistor M6 is connected to a second power supply rail $V_{DD1}$ at 602. For the preferred embodiment, this supply voltage is about 1.8 volts. $V_{DD2}$ must be greater than $V_{DD1}$ by at least the threshold voltage of transistor M6 for the active inductor formed by R1 and M6 to operate, i.e., the transistor M6 must operate in its active region. The combination of R1 and M6 is called active inductor $AI_1$, to be described in FIG. 7.

The source of transistor M6 is connected to the source of PMOS transistor M4, labeled $V_{OUT}^-$, while the drain terminal of transistor M4 is connected to the drain terminal of NMOS transistor M1 at 603-1. The source of transistor M4 is connected to the drain of transistor M4. Transistor M4 with drain to source terminals shorted is called CMOS capacitor $CC_1$, to be described further in FIG. 8. The source terminal of transistor M1 is connected to the drain terminal of NMOS transistor M3, while the source terminal of transistor M3 is electrically connected to ground potential.

The remaining transistors and resistor are the mirror images of those already described so as to form a differential pair. The drain of transistor M3 is connected to the source of NMOS transistor M2. The drain of PMOS transistor M5 is connected to the drain of transistor M2 at 603-2, while the gate of transistor M5 is connected to the gate of transistor M4. The source of transistor M5 is connected to the source of NMOS transistor M7, labeled $V_{OUT}^+$. The drain of transistor M5 is connected to the source of transistor M5. Transistor M5 with drain to source shorted is called CMOS capacitor $CC_2$, to be described in FIG. 8. The drain of transistor M7 is connected to power supply $V_{DD1}$ at 602. The gate of transistor M7 is connected to one end of resistor R2, while the other end of transistor R2 is connected to supply voltage $V_{DD2}$ at 601. The combination of R2 and M7 is called active inductor $AI_2$, to be described in FIG. 7.

The gate of transistor M1 is labeled as differential positive input voltage $V_{in}^+$, while the gate of transistor M2 is labeled as differential negative input voltage $V_{in}^-$. A differential input voltage from a previous delay cell stage is connected to these inputs. The gate terminals of both transistor M4 and M5 are labeled as control voltage $V_{control}$, which is the voltage control terminal that varies the LC oscillator circuit capacitance. The source of transistor M6 is labeled as differential negative output voltage $V_{out}^-$, while the source of transistor M7 is labeled as differential positive output voltage $V_{out}^+$. The differential output leads are connected to the differential inputs of another delay cell. A bias voltage, labeled $V_{bias}$, is connected to the gate of transistor M3 to provide a constant DC bias current to the differential pair circuit. The circuit as a whole is differential input/output to as to reduce the circuit's susceptibility to noise.

In the prior art of FIG. 5, the LC portion of the differential pair oscillator cell was realized by a physical passive inductance component, and a varactor diode that was reverse biased to provide the variable capacitor function. This variable capacitor, which sets the oscillation frequency, is controlled by a voltage applied to the cathode of the diode.

In FIG. 6, the passive inductor is replaced by what is called an active inductor. There are two active inductors in the illustrative embodiment: one comprising resistor R1 and NMOS transistor M6, and a second comprising resistor R2 and NMOS transistor M7.

Figure 7A:
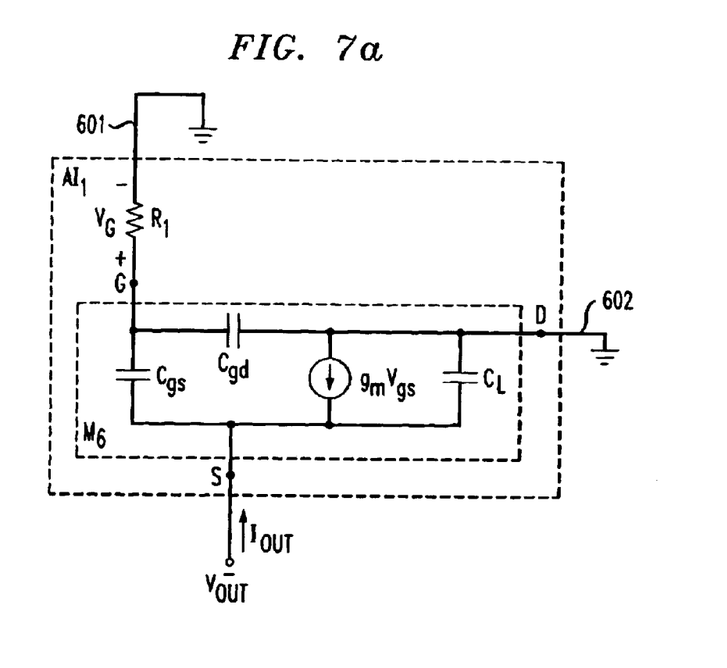
FIG. 7 depicts a schematic of the small signal model for the active inductor of FIG. 6.
Figure 7B:
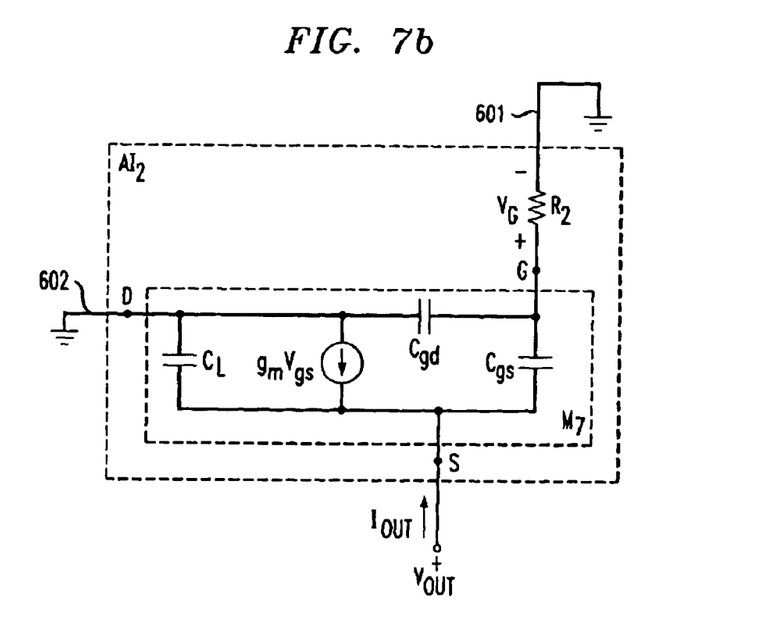

FIG. 7 depicts schematics of the small signal model for the active inductors of FIG. 6. FIG. 7a represents active inductor $AI_1$ of FIG. 6, while FIG. 7b represents active inductor $AI_2$ of FIG. 6. The DC power supply rails at 601 and 602 have been replaced by AC ground potentials. For the analysis we will look at FIG. 7a. At node $V_g$, we have $$sC_{gsl}(V_g - V_{ol}) + \frac{V_g}{R1} + V_g sC_{gdl} = 0 \qquad \text{(Eq. 1)}$$

Rearranging slightly, we have $$V_g = \frac{sC_{gsl}R1V_{ol}}{1 + sR1(C_{gsl} + C_{gdl})} \qquad \text{(Eq. 2)}$$

At node $V_{OUT}^-$, $$I_{o1} = g_{m1}(V_g - V_{o1}) + (V_g - V_{o1})sC_{gs1} - V_{o1}sC_L \qquad \text{(Eq. 3)}$$

Solving (2) and (3), we have $$Z_o = \frac{V_{ol}}{I_o} = \left[ \frac{(1 + sR1(C_{gsl} + C_{gdl}))}{[R1(C_{gdl}C_{gsl} + C_{gsl}C_L + C_{gdl}C_L)]s^2 +} \right] \qquad \text{(Eq. 4)}$$
$$\left[ [(C_{gsl} + C_L + g_{m1}R1C_{gdl})]s + g_{m1} \right]$$

From equation (4) the poles (6 and 7) and zero (5) can be identified as:

$$Z_1 = \frac{1}{R1(C_{gsl} + C_{gd})} \qquad \text{(Eq. 5)}$$

$$P_1 = \frac{g_{m1}}{C_{gs1} + C_L + g_{m1}R1C_{gd1}} \quad \text{(Eq. 6)}$$

$$P_2 = \frac{C_{gs1} + C_L + C_{gd1}}{R1(C_{gs1}C_{gd1} + C_LC_{gd1} + C_LC_{gs1})} \quad \text{(Eq. 7)}$$

Figure 8:
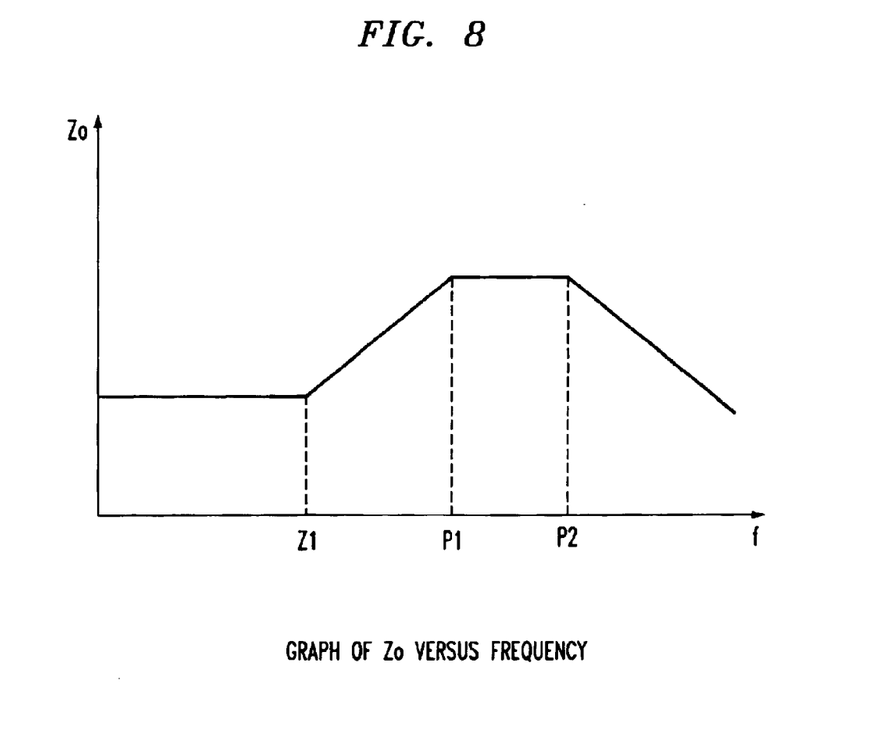
FIG. 8 depicts a bode-plot of the magnitude of $Z_o$ as a function of frequency.
Figure 9A:
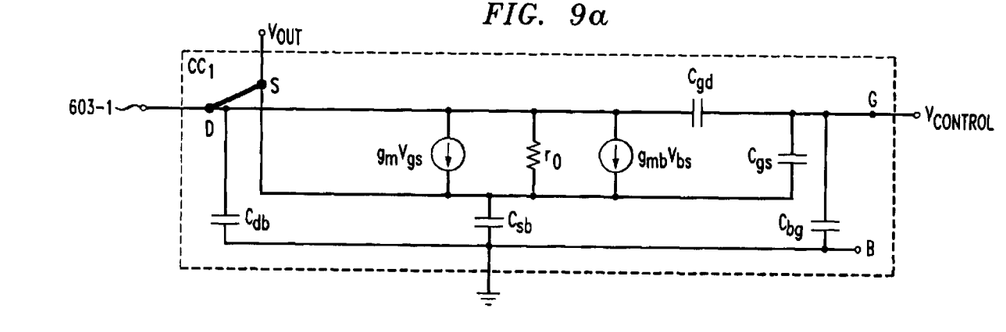
FIG. 9 depicts a schematic of the small signal model for the CMOS capacitor constructed from an MOS transistor.
Figure 9B:
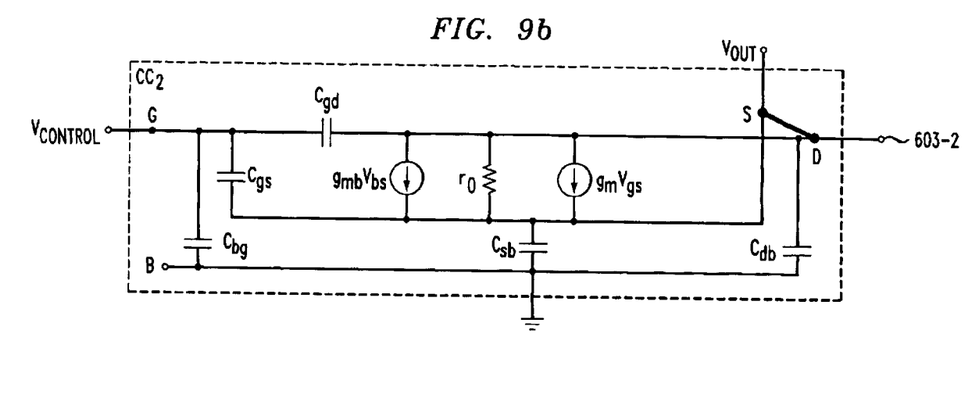
Figure 9C:
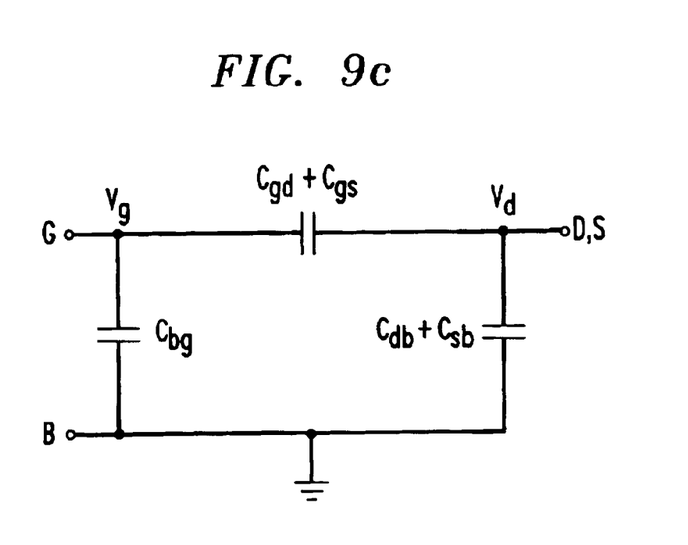
Figure 9D:
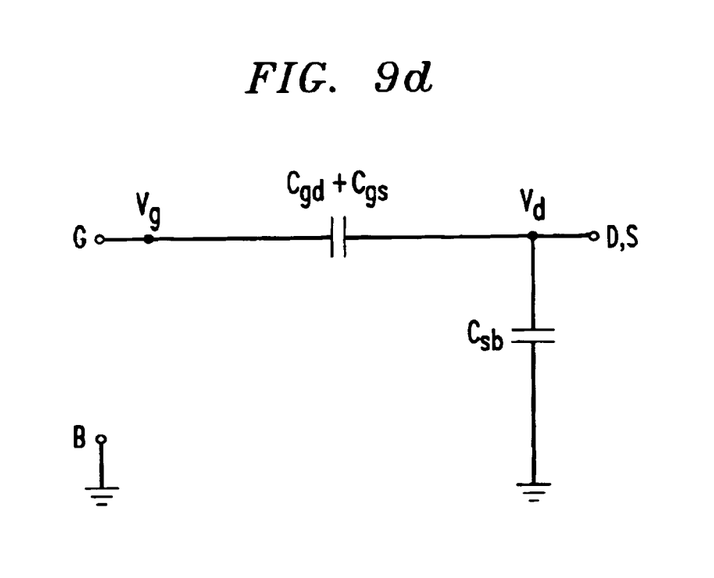

FIG. 8 depicts a bode-plot of the magnitude of $Z_o$ as a function of frequency. In the range of frequency between $Z_1$ and $P_1$, the active inductor induces a zero, increasing gain with frequency, similar in function to a real inductor. The active inductor introduces inductive impedance as a load at the oscillator frequencies of interest.

The varactor diodes are replaced by two PMOS transistors, M4 and M5, respectively. For each transistor, the source terminal is electrically connected to the drain terminals. A variable capacitor is formed by the PN junction comprising the semiconductors between the drain and gate terminal of M6, or between the drain and gate terminal of M7. In this CMOS capacitor, the gate acts as a plate and the drain and source connected together act as a second plate. The two plates are separated by silicon oxide, which acts as a dielectric, and this configuration makes the MOS transistor act as a capacitor.

The varactor effect is achieve by applying a positive voltage to the gate terminal of M4 in the range of 0.9 to 1.3 Volts for the case of a supply voltage of 1.8 volts with 0.18 micron CMOS technology. It will be clear to those skilled in the art, however, how to make and use alternative embodiments of the present invention in which the supply voltage and process technology can be varied to give different ranges of control voltage and hence different tuning ranges of the LC oscillator.

FIG. 9 depicts a schematic of the small signal model for the CMOS capacitor constructed from an MOS transistor. FIG. 8a depicts the high frequency model of the MOS transistor from the perspective of $CC_1$ of FIG. 6, with the addition of the drain terminal being electrically connected to the source terminal. FIG. 8b depicts the small signal model of CMOS capacitor $CC_2$ of FIG. 6. The analysis for both CMOS capacitors is the same.

Terminal B, which is electrically connected to AC ground, is the bulk or substrate connection of the device not normally shown in transistor schematics. When the drain terminal is electrically connected to the source terminal, the dependent sources, $g_m V_{gs}$ and $g_{mb}V_{bs}$, are shorted, as well as the output resistance $r_o$. The schematics of FIGS. 8a and 8b reduce to that of FIG. 8c, which shows a gate to bulk capacitance, $C_{gb}$, a drain to bulk capacitance, $C_{db}$ in parallel with source to bulk capacitance, $C_{sb}$, and gate to drain/source capacitances $C_{gd}$ and $C_{gs}$ in parallel. Since $C_{gb}$ and $C_{db}$ are negligible compared to $C_{sb}$ and the combination of $C_{gd}$ and $G_{gs}$, $C_{gb}$ and $C_{db}$ can be ignored. The circuit further reduces to FIG. 8d. The relationship between the gate control voltage and the device capacitance is as follows: Taking node $V_g$ as a reference, we have $$\frac{V_g - V_d}{(C_{gd} + C_{gs})s} = \frac{V_d}{sC_{sb}} \quad \text{(Eq. 8)}$$

and $$V_g - V_d = V_{gd} \quad \text{(Eq. 9)}$$

Rearranging (8) gives $$V_{gd} = \frac{V_d}{C_{sb}}(C_{gd} + C_{gs}) \quad \text{(Eq. 10)}$$

The voltage at the gate is proportional to the gate-drain and gate-source capacitances.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. An apparatus comprising:
    a first NMOS field effect transistor having a gate terminal, a source terminal, and a drain terminal;
    a first resistor having a first terminal and second terminal, wherein said first terminal of said first resistor is electrically connected to said gate terminal of said first NMOS field effect transistor;
    a first PMOS field effect transistor having a gate terminal, a source terminal, and a drain terminal, wherein said source terminal of said first PMOS field effect transistor is electrically connected to said source terminal of said first NMOS field effect transistor, and wherein said drain terminal of said first PMOS field effect transistor is electrically connected to said source terminal of said first PMOS field effect transistor; and
    a second NMOS field effect transistor having a gate terminal, a source terminal, and a drain terminal, wherein said drain terminal of said second NMOS field effect transistor is electrically connected to said drain terminal of said first PMOS field effect transistor.

2. The apparatus of claim 1 wherein a first voltage applied to said second terminal of said first resistor is greater than a second voltage applied to said drain terminal of said first NMOS field effect transistor by at least the gate-to-source threshold voltage of said first NMOS field effect transistor.

3. The apparatus of claim 1 further comprising a third NMOS field effect transistor having a gate terminal, a source terminal, and a drain terminal, wherein said drain terminal of said third NMOS field effect transistor is electrically connected to said source terminal of said second NMOS field effect transistor.

4. The apparatus of claim 3 wherein said source terminal of said third NMOS field effect transistor is electrically connected to ground voltage.

5. The apparatus of claim 3 further comprising a fourth NMOS field effect transistor having a gate terminal, a drain terminal, and a source terminal, wherein said source terminal of said fourth NMOS field effect transistor is electrically connected to said source terminal of said second NMOS field effect transistor.

6. The apparatus of claim 5 further comprising a second PMOS field effect transistor having a gate terminal, a drain terminal, and a source terminal, wherein said drain terminal of said second PMOS field effect transistor is electrically connected to said drain terminal of said fourth NMOS field effect transistor, wherein said drain terminal of said second PMOS field effect transistor is electrically connected to said source terminal of said second PMOS field effect transistor, and wherein said gate terminal of said second PMOS field effect transistor is electrically connected to said gate terminal of said first PMOS field effect transistor.

7. The apparatus of claim 6 further comprising a fifth NMOS field effect transistor having a gate terminal, a drain terminal, and a source terminal, wherein said source terminal of said fifth NMOS field effect transistor is electrically connected to said source terminal of said second PMOS field effect transistor, and wherein said drain terminal of said fifth NMOS field effect transistor is electrically connected to said drain terminal of said first NMOS field effect transistor.

8. The apparatus of claim 7 further comprising a second resistor having a first and second terminal, wherein said first terminal of said second resistor is electrically connected to said gate terminal of said fifth NMOS field effect transistor, and wherein said second terminal of said second resistor is electrically connected to said second terminal of said first resistor.

9. The apparatus of claim 8 wherein the gate terminal of said first PMOS field effect transistor is connected to a control voltage in the range of about 0.9 Volts to about 1.3 Volts.

10. The apparatus of claim 8 wherein said first NMOS field effect transistor, said second NMOS field effect transistor, said third NMOS field effect transistor, said fourth NMOS field effect transistor, said fifth NMOS field effect transistor, said first PMOS field effect transistor, and said second PMOS field effect transistor are produced using a 0.18 micron process.

11. The apparatus of claim 8 wherein a supply voltage applied to said drain terminal of said first NMOS field effect transistor is about 1.8 volts.

12. The apparatus of claim 8 further comprising:

a positive input terminal wherein said positive input terminal is electrically connected to said gate terminal of said second NMOS field effect transistor;

a negative input terminal wherein said negative input terminal is electrically connected to said gate terminal of said fourth NMOS field effect transistor;

a bias input terminal wherein said bias input terminal is electrically connected to said gate terminal of said third NMOS field effect transistor;

a control input terminal wherein said control input terminal is electrically connected to said gate terminal of said first PMOS field effect transistor;

a positive output terminal wherein said positive output terminal is electrically connected to said source terminal of said fifth NMOS field effect transistor; and, a negative output terminal wherein said negative out terminal is electrically connected to said source terminal of said first NMOS field effect transistor.

* * * * *